(12) United States Patent
Rafalowski et al.

(10) Patent No.: US 12,484,161 B2
(45) Date of Patent: Nov. 25, 2025

(54) PRINTED CIRCUIT BOARD HOUSING AND ASSEMBLY PROCESS

(71) Applicant: Aptiv Technologies AG, Schaffhausen (CH)

(72) Inventors: Arkadiusz Rafalowski, Brzezinka (PL); Janusz Duralek, Krynica Zdroj (PL)

(73) Assignee: Aptiv Technologies AG, Schaffhausen (CH)

( * ) Notice: Subject to any disclaimer, the term of this patent is extended or adjusted under 35 U.S.C. 154(b) by 87 days.

(21) Appl. No.: 18/392,272

(22) Filed: Dec. 21, 2023

(65) Prior Publication Data

US 2024/0215178 A1  Jun. 27, 2024

(30) Foreign Application Priority Data

Dec. 21, 2022 (EP) .................................. 22215705

(51) Int. Cl.
*H05K 5/00* (2025.01)

(52) U.S. Cl.
CPC .................................. *H05K 5/006* (2013.01)

(58) Field of Classification Search
CPC ........................................................ H05K 7/00
See application file for complete search history.

(56) References Cited

U.S. PATENT DOCUMENTS

| 9,491,342 | B2 | 11/2016 | Winter |
| 9,565,342 | B2 | 2/2017 | Sauer |
| 9,621,769 | B2 | 4/2017 | Mai |
| 10,477,080 | B2 | 11/2019 | Kunze |
| 10,560,613 | B2 | 2/2020 | Conger |
| 2005/0048850 | A1 | 3/2005 | Zoller |
| 2018/0345911 | A1* | 12/2018 | Zurowski ............... G03B 17/55 |
| 2018/0352120 | A1* | 12/2018 | Zurowski ............... H05K 5/069 |

OTHER PUBLICATIONS

Extended European Search Report for EP App. No. 22215705.9 dated Jun. 5, 2023, 11 pages.

* cited by examiner

*Primary Examiner* — Jerry Wu
(74) *Attorney, Agent, or Firm* — Miller Johnson

(57) ABSTRACT

A housing for a printed circuit board (PCB) includes a housing base and a housing body. The housing base and the housing body each include first and second corresponding coupling members configured to provide a two-part coupling of the housing base to the housing body to form the housing. The housing base includes a PCB retainer. The housing body includes a corresponding PCB receiver. The PCB retainer and the PCB receiver are configured such that, when the housing base is coupled to the housing body, the PCB is retained in position securely therebetween.

9 Claims, 12 Drawing Sheets

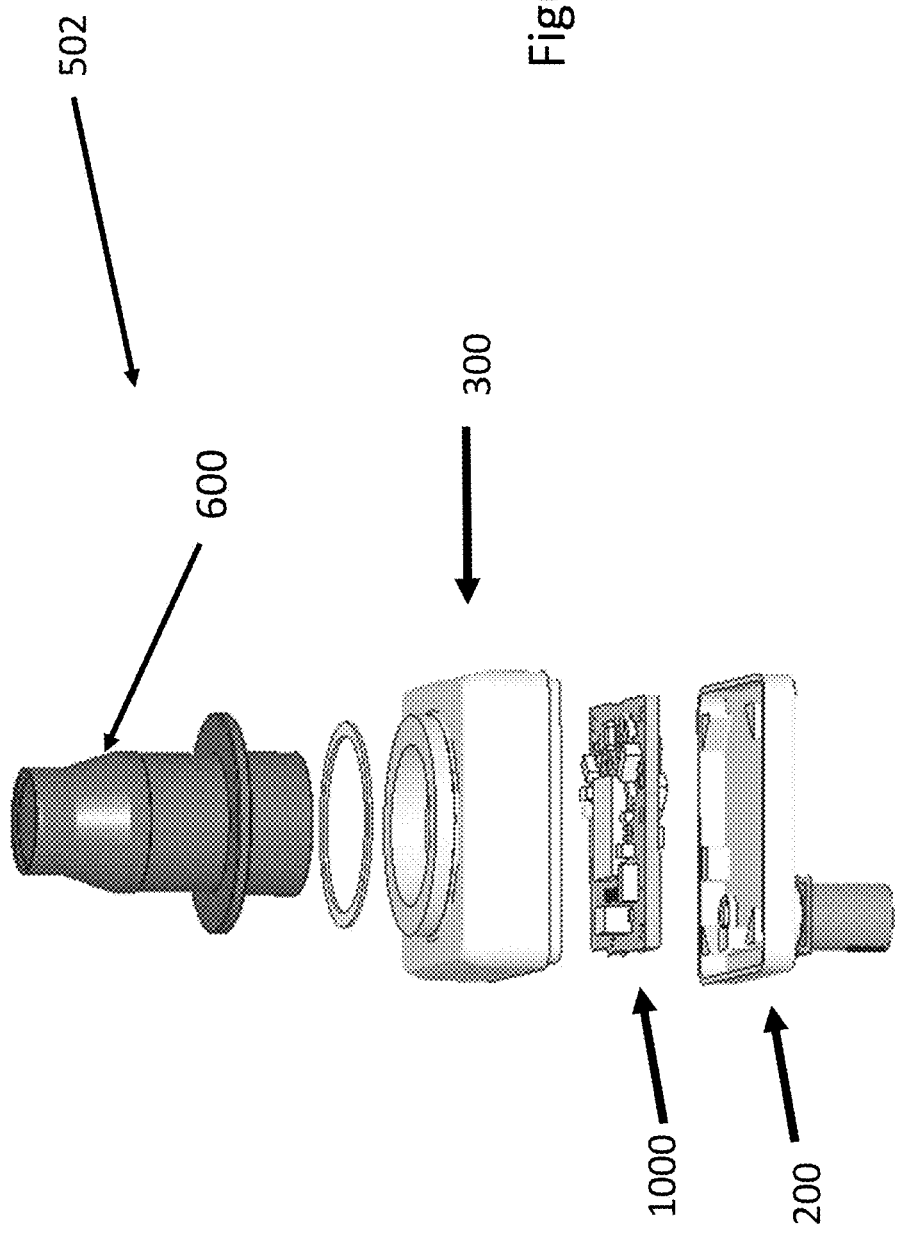

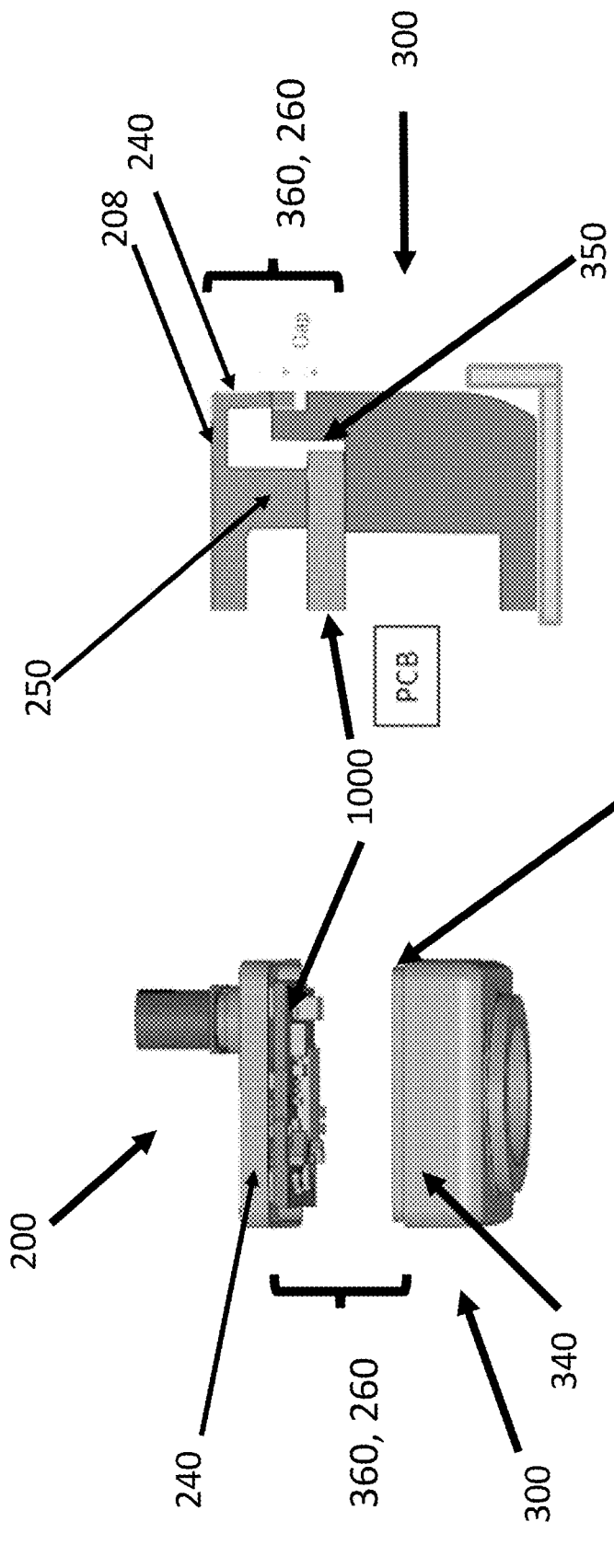

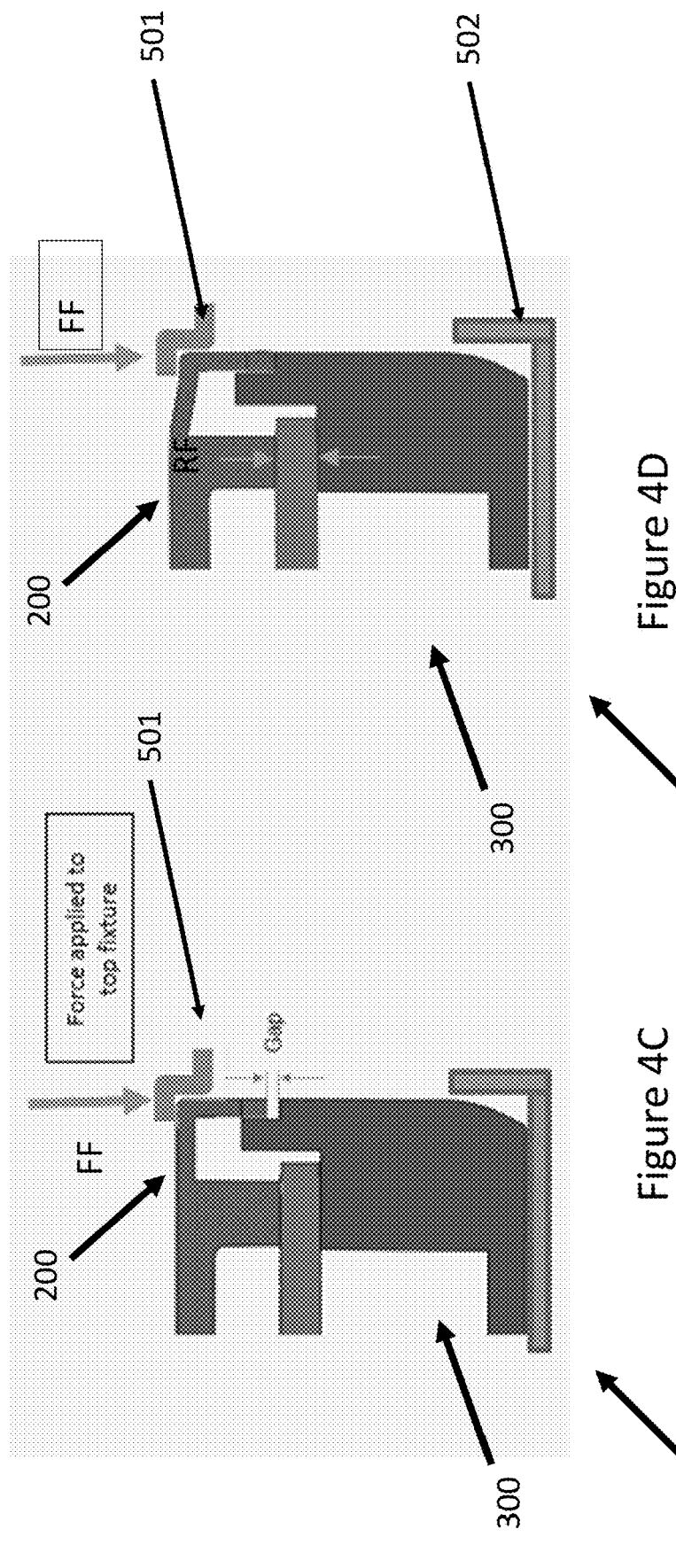

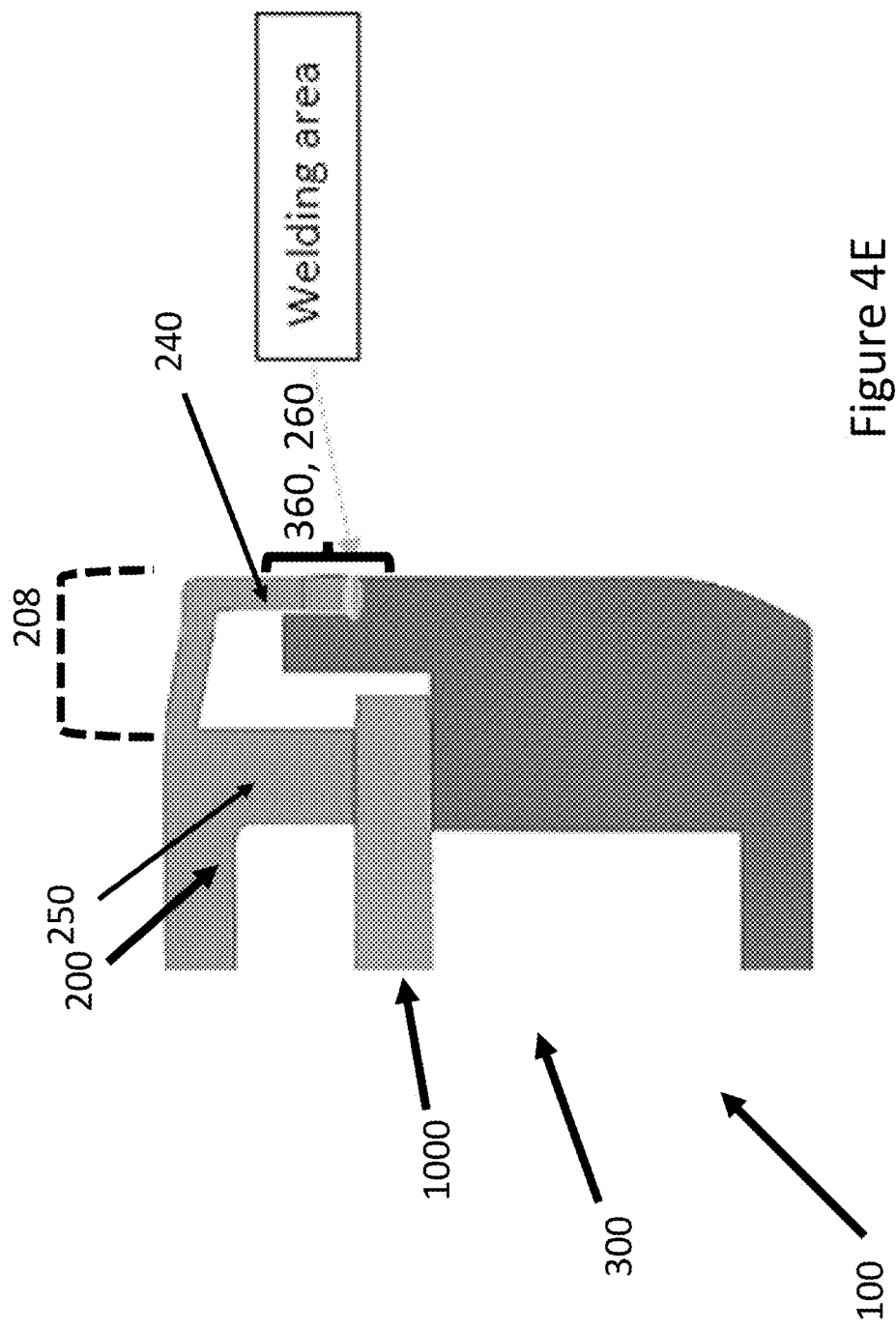

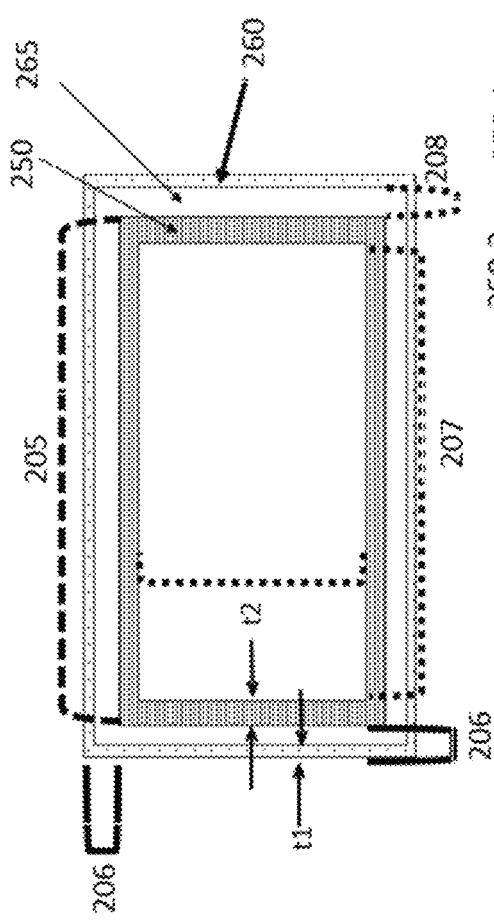
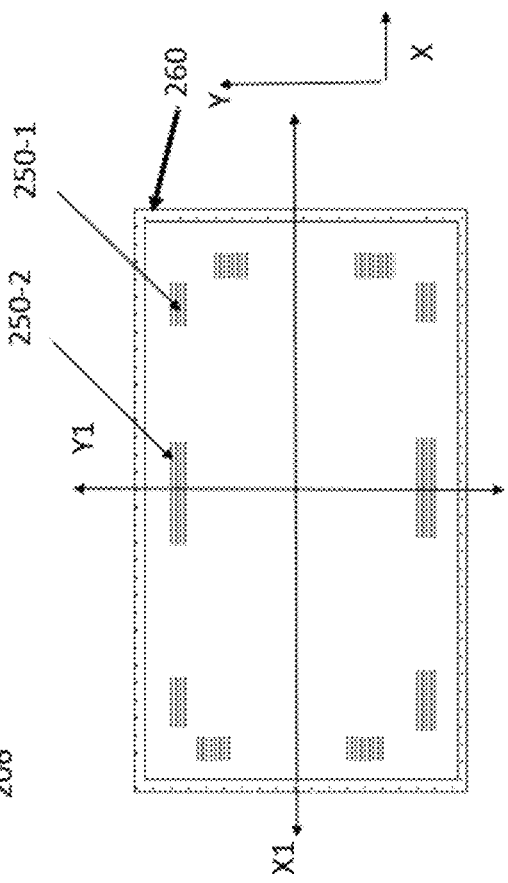
Figure 5A
Figure 5B

PRINTED CIRCUIT BOARD HOUSING AND ASSEMBLY PROCESS

CROSS-REFERENCE TO RELATED APPLICATIONS

This application claims priority to European App. No. 22 215 705 filed Dec. 21, 2022, the entire disclosure of which is incorporated by reference.

FIELD

The present disclosure generally relates to printed circuit board integration and more particularly to housings and assembly methods for printed circuit board retention.

BACKGROUND

PCBs are widely used within electronic systems in automotive and other applications. In use a PCB is often provided assembled together with components in a housing. Current assembly processes have been found to give rise challenges including the necessity to maintain tolerances along assembly direction. In addition, problems can arise due to the high deformation and strains of the PCB during and after assembly process which could result in a proportion of the assembled device being damaged or unsuitable for use. Taking account of the challenges of the process of manufacture, a higher bill of materials and process cost may often arise.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In view of the above, there is a need to provide an improved PCB housing assembly and an improved process for assembly that addresses the above issues and reduces the occurrence of PCB deformation or strain and provides an improved PCB arrangement.

It is an aim of the present disclosure to provide an improved PCB housing assembly and an improved process for assembly of the PCB and housing. These arrangements are directed to addressing problems associated with existing arrangements and approaches.

According to a first aspect, the specification provides a housing assembly for a PCB. According to a first aspect of the specification and claims there is provided a housing (100) for housing a PCB (1000) comprising a housing base (200) and a housing body (300) configured for coupling to the base to form the PCB housing (100). The base and the housing body each comprising first and second corresponding coupling members configured to provide a two-part coupling of the base to the body. The base (200) comprises a PCB retainer (250) and the housing body (300) comprises a corresponding PCB receiver (350), configured such that when the base (200) is coupled to the housing body (300), the PCB is retained in position securely therebetween.

The components of the housing are each arranged for coupling together in two distinct parts. First of all, each of the base and housing body is configured to retain the PCB within the housing. The PCB is retained securely and evenly, while being protected from any undesired forces.

According to an embodiment of the first aspect, the base (200) comprises a base connection member (260) and the body comprises a corresponding body connection member (360), configured for coupling together to fix the base to the housing body to form the PCB housing.

Second of all, each of the base and housing body is configured for fixing together to form the overall housing. The fixing is provided at locations spaced apart and separate from the locations at which the PCB is retained.

Advantageously, the two-part coupling arrangement provided for by the configuration of both housing body and the base provides for an accuracy in locating the PCB within the housing, and a secure retention of the PCB while protecting the PCB for any non-desired forces that might arise during assembly. Further the arrangement allows for accuracy of location of the corresponding retainer and receiver with the PCB internally within the housing, as guided and controlled by the location of the connection members at the external portion of the housing. Finally fixing forces relating to the assembly or fixing of the housing are directed through the connection members are not to the PCB. The PCB is not subjected to additional forces during fixing. However, when the housing parts are engaged retention forces acting between the housing and PCB provide for a positive engagement of the PCB with the receiver and retainer. The retention forces are controlled by the configuration that provides a receiver of depth corresponding to that of the PCB. AS the connection between the base and body is closed the receiver and retainer are drawn in a closer engagement with the PCB.

According to an embodiment of the first aspect, the receiver (350) and the retainer (250) are configured to engage the PCB (1000) simultaneously at a plurality of peripherally located contact portions of the upper and lower surfaces thereof.

Advantageously, arrangements of the specification allow for the PCB to be retained with precision at a required transverse orientation and vertical level within the housing. The contact with the receiver and the retainer may be limited to defined areas of the PCB. The arrangement of the receiver and the retainer and the control of forces applied at their interface with the PCB avoids application of uneven forces that might cause strain at certain areas of the PCB or affect the plane of orientation of the PCB, which could in turn reduce the accuracy of the location of components on the PCB relative to other component mounted to the housing. The arrangement of the specification is such that the PCB is maintained with precision in the required transverse (for example X-Y) plane at the required vertical level (for example Z) within the housing. The PCB is maintained in a horizontal orientation relative to the housing and components connected to the housing. According to the arrangements of the specification, the PCB is protected from forces that might other arise during assembly of a PCB to a housing. The retention force is a controlled force limited such that a positive contact is provided at the contact surfaces adjacent to the PCB but additional forces are not applied or transmitted from other parts of the housing to the PCB. The receiver and retainer are configured such that the respective contact surfaces are spaced apart as required to accommodate the PCB without exerting force on the PCB.

According to an embodiment of the first aspect, the base connection member and the body connection member are located externally to and spaced apart from the receiver and retainer such that forces required to fix the base to the body are directed to the connection members at locations offset from the PCB.

In the arrangements of the drawings, by virtue of the configuration of the housing components, forces acting to retain the PCB in the receiver act in the vertical direction (for example in the drawing vertical axis Z2) relative to the housing in the direction of interfaces of the retainer with the PCB and the PCB with the receiver. The force for fixing the housing is directed at a portion of the housing (vertical axis) that is offset from the retainer and the receiver longitudinally and/or laterally. Optionally, the connection members may be located spaced apart in longitudinal and/or lateral directions relative to the receiver and retainer.

According to an embodiment of the first aspect, the base connection member (260) is configured to be displaced under the application of force to bring the base connection member (260) into engagement with the connection member (360) of the housing for fixing thereto.

In an arrangement, the base connection member is comprised of a portion that is configured to be displaceable relative to the other portions of the base such as the retention wall and a central cover portion. The base connection member is also displaceable relative to other portions of the housing body including the side wall at which it is connected. When a fixing force is applied to the base the connection member, configured by virtue of its location and properties, moves under the fixing force into engagement with the connection member of the body. The connect surface of the body connection member defines a stop or clamping surfaces that prevents further movement of the base relative to the body. The fixing force which acts to deform or displace the connection member is accordingly directed to and predominantly acts on the connection member. The stop is offset in the vertical direction relative to the contact surface of the receiver by a distance corresponding to the depth of the PCB, this configuration provides for the control of force between the housing and PCB and limiting of forces at the PCB. The arrangement provides for a sturdy retention of the PCB while preventing the transmission of other forces such as a fixing force to the PCB. The fixing force is directed to the connection members and away from the PCB.

According to an embodiment of the first aspect, in a first part of the two-part coupling of the base and housing, the first and second coupling members of base and housing are brought into alignment and located in a first pre-fixing position. In the first pre-fixing position, the PCB is located within the receiver such that a contact portion of an upper surface of the PCB is engaged in contact with the receiver, and the retainer is arranged in contact with an opposing contact portion of a lower surface of the PCB.

In an arrangement, in the first pre-fixing position the connection member (260) of the base is located offset in transverse (for example X-Y) and vertical (for example Z) directions relative to the retainer of the base, and the connection member (360) of the body is located offset in transverse (X-Y) and vertical (Z) directions relative to the receiver (350). In the second fixed position, the connection member (260) of the base is located at the same vertical level relative to the Z direction as the retainer. The base connection member (260) configured to move relative to other portions of the housing under the application of force to allow it to be located for fixing to the body connection member. The connection member 260 is configured to be displaced in the vertical direction relative to the other parts of the housing for fixing.

Further in an arrangement the base and body are configured such that in the pre-fixing position the PCB is retained in positive contact with the receiver and the retainer. The receiver and retainer have a quadrilateral or similar form that corresponds to the form of the PCB, together they define a frame that retains the PCB by engaging a peripheral portion of the PCB around the sides of the PCB. The PCB is securely and evenly retained, forces between the contact surfaces of the receiver and retainer and the peripheral contact surface portions of the PCB are applied evenly and dispersed. A relatively large surface area of contact is provided between the PCB and the housing. Similarly, by retaining the PCB are the peripheral portions thereof a relatively large surface area at each of the upper and lower surfaces of the PCB is available for access. The retainer and receiver co-operate to locate the PCB at a required transverse orientation at a required vertical level within the housing. The PCB is held stably within the housing, while at the same time the PCB is protected from undesired forces.

According to an embodiment of the first aspect, in a first pre-fixing position the connection member of the base is located in a pre-fixing position at the connection member of the body, such that the contact surface of the connection members are vertically aligned and a contact surface of the base connection member is located spaced apart in the vertical direction from a corresponding contact surface of connection member of the body.

Advantageously, the form of the first and second coupling members of the base and housing body allows for a pre-fixing location with the coupling members in alignment in transverse and vertical directions but with the connection members spaced apart from each other. In the pre-fixing position, the PCB is located as required, and the connection members are located vertically aligned in preparation for the application of the fixing force to bring the connection member of the base (260) into engagement for fixing to the connection member of the housing.

According to an embodiment of the first aspect, in a second part of the two-part coupling of the base and housing, the connection member (260) of the base and the connection member (360) of the housing located aligned in the pre-fixing position, are brought into engagement. The base connection member (260) is configured for displacement under the application of an external force to move a contact surface (263) of the base connection member into engagement at a fixing position with a contact surface (363) of the connection member of the body.

Advantageously, the connection members brought into engagement are arranged to be fixed at a connection interface between the base and body. The connection member (260) is displaced in a vertical direction parallel to the central vertical axis of the housing. The engagement is a sliding engagement in which the vertically oriented contact surfaces (262, 362) of the side walls overlap as the upper contact surface (263) of the base connection member is moved into a clamping engagement with the stop (363) of the body connection member. The movement and connection for fixing is directed in generally vertical directions and planes. As the connection member (262, 263) is already alignment with the connection member receiver (360. 362, 363) of the body and formed and dimensioned for correspondence with the receiver, forces are not exerted in transverse directions from the external wall towards the receiver. The fixing forces act in vertical directions between the connection members.

According to an embodiment of the first aspect, the housing body (300) comprises a transverse cover portion (302) and a peripheral side wall (340) depending from an outer peripheral portion (309) thereof, the peripheral side wall comprising a first inner recess (351) defining the PCB receiver (350) and a second outer recess (361) defining the housing body connection member (360).

According to an embodiment of the first aspect, the inner recess (351) is located offset in the vertical direction relative to the outer recess (361) by a distance corresponding to the depth of the PCB to be located between the retainer and the receiver of the housing, wherein the PCB receiver and the body connection member are configured to provide control of forces between the housing and PCB.

Optionally, the peripheral side wall (340) having an inner surface (341) and an outer surface (342), wherein the inner and outer recesses are formed on the opposing surfaces of the wall (340) at a lower base face portion thereof and wherein the inner (351) and outer (361) recesses extend continuously about the peripheral side wall (340) spaced apart by an intermediate wall portion (365).

According to an embodiment of the first aspect, the base is configured for correspondence and mating with the housing body. The base includes a base cover portion (202), which includes a central cover portion (205) and a peripheral cover portion (206, 208). The base further includes an external peripheral wall and an internal wall (250) each extending from the base in the direction of the housing body and configured for coupling thereto. The external peripheral wall (240) is arranged spaced apart from the internal wall (240) and extending parallel thereto. The peripheral cover portion (208) is arranged between the internal and external walls and connects the external wall to the central cover portion.

In an arrangement, the base cover portion (202) comprises central cover portion (205) and a peripheral cover portion (206), the second peripheral cover portion (206) extending about the central cover portion and between the internal wall (250) and the external wall (240), the peripheral cover portion configured to connect the external wall (240) to the central cover portion.

According to an embodiment of the first aspect, the peripheral cover portion (206, 208) is displaceable relative to other portions of the cover (200) and the housing body (300), wherein the peripheral cover portions (206, 207) such that it is moveable or deformable when a force is applied thereto.

According to an embodiment of the first aspect, the peripheral cover portion (206, 208) together with the external wall (240) defines the connection member (260) of the base, the connection member (260) configured such that the application of an external force thereto provides for movement of the connection member (260) relative to other portions of the base to bring the connection member (260) into engagement with the connection member of the body.

According to an embodiment of the first aspect, the location of the connection member of the body at the fixing position with the connection member of the base, results in application of a retention forces between the receiver and the retainer and contact surfaces portions of the PCB, to retain the PCB in location within the housing.

Optionally, the peripheral cover portion having a wall of depth d2 less that the depth d1 of the wall at the central cover portion, is configured to be displaceable by virtue of the form and properties thereof. It is configured to be displaced such that the application of a force at an outer edge portion of the base provides for a displacement of the connection member 260 and outer wall relative to the retainer.

In a further arrangement, the base and body are formed for correspondence wherein housing body (300) comprises a transverse cover portion (302) and a peripheral side wall (340) depending from an outer edge portion (309) of the cover (302), the peripheral side wall (340) having an inner surface (341) and an outer surface (342) an upper end (343) and a lower end (344), wherein the lower end (344) comprises a first inner recess defining the PCB receiver (350) and a second outer recess defining the housing body connection member (360), the first and second recesses arranged to extend around the peripheral side wall (340) of the housing.

According to a further aspect, the base (200) comprises a cover portion (202) having an inner surface (203) and an outer surface (204). The base further comprises a peripheral external side wall (240) arranged about the periphery of the cover portion and extending therefrom in the direction of the housing body. The base further comprises an internal wall (250) arranged generally parallel to the peripheral external wall and spaced apart therefrom and extending in the direction of the housing body from the inner surface (203), the internal wall having an inner surface (251) and an outer surface (252). The cover portion (202) comprising a central cover portion (205) and a peripheral cover portion (206), the central cover portion (205) being that area of the cover portion that extends between opposing outer surfaces (252) of the internal wall (250) and the peripheral cover portion (206) being that area of the cover portion (202) that extends between the outer surface (252) of the internal wall (250) and the outer surface (242) of the peripheral external wall (240).

According to an arrangement, the first base connection member is configured to be movable relative to other portions of the housing such that when a force is applied to fix the base to the body, the base connection member is deformable to bring a contact surface thereof into contact with the housing body. It is appreciated that the connection member may be displaceable by virtue of the form, properties or materials thereof.

According to a third aspect there is provided a method for assembly of assembly of a PCB housing to provide a controlled location and retention of a PCB for operation. The method comprising providing a housing as claimed in any preceding claim, locating the PCB in the housing receiver, locating the base and body in a pre-fixing position, applying a fixing force such that displacement of a connection member of the base into a fixing location relative to a connection member of the housing body, and fixing the base to the body.

Advantageously, the housing is configured including such that the resultant forces acting between the two housing parts provides for a retention force between the housing body and base and the PCB to retain the PCB in location, as required.

The various arrangements and embodiments of the specification provide improvements.

BRIEF DESCRIPTION OF THE DRAWINGS

The following drawings are provided as an example to explain further and describe various aspects of the present disclosure.

FIG. 1A provides a cross-sectional view of both parts of the housing located for engagement in a first pre-fixing position for coupling of the base to the body;

FIGS. 1B and 1C are close up views of the connection between the corresponding coupling features of each of the 2-parts; FIG. 1D shows the different portions of the housing assembly of FIG. 1A.

FIG. 3 is a perspective view of first and second parts respectively of a housing assembly according to the specification, in particular the housing is configured to house a PCB and to support a lens 600 and optical components as required relative to the PCB for example for use with a camera mounted on the PCB.

FIGS. 4A, 4B, 4C, 4D, and 4E provide cross-sectional views of the two-part housing assembly of the specification in which a housing base and main body are provided for coupling and following the steps of coupling of an assembly process; in FIG. 4 as, the base and body are provided; in FIG. 4B the base and body are coupled in a pre-fixing position; in FIG. 4C an actuator or tool is located at the edge portion of the base in preparation for the application of a fixing force; in FIG. 4D the force is applied and acts in vertical directions and planes to displaces the connection to a fixing position at which it is engaged with the connection member of the body; in FIG. 4E the connection members have been coupled and fixed together in a fixing position such that a connection member of the base is located at the fixing position in a connection of the body and the housing is sealed;

FIGS. 5A and 5B are illustrations in the form of top plan view of the coupling features of arrangements on the inner surface of the base, showing configurations of the coupling features;

In the drawings, reference numbers may be reused to identify similar and/or identical elements.

DETAILED DESCRIPTION

Figure 1A:
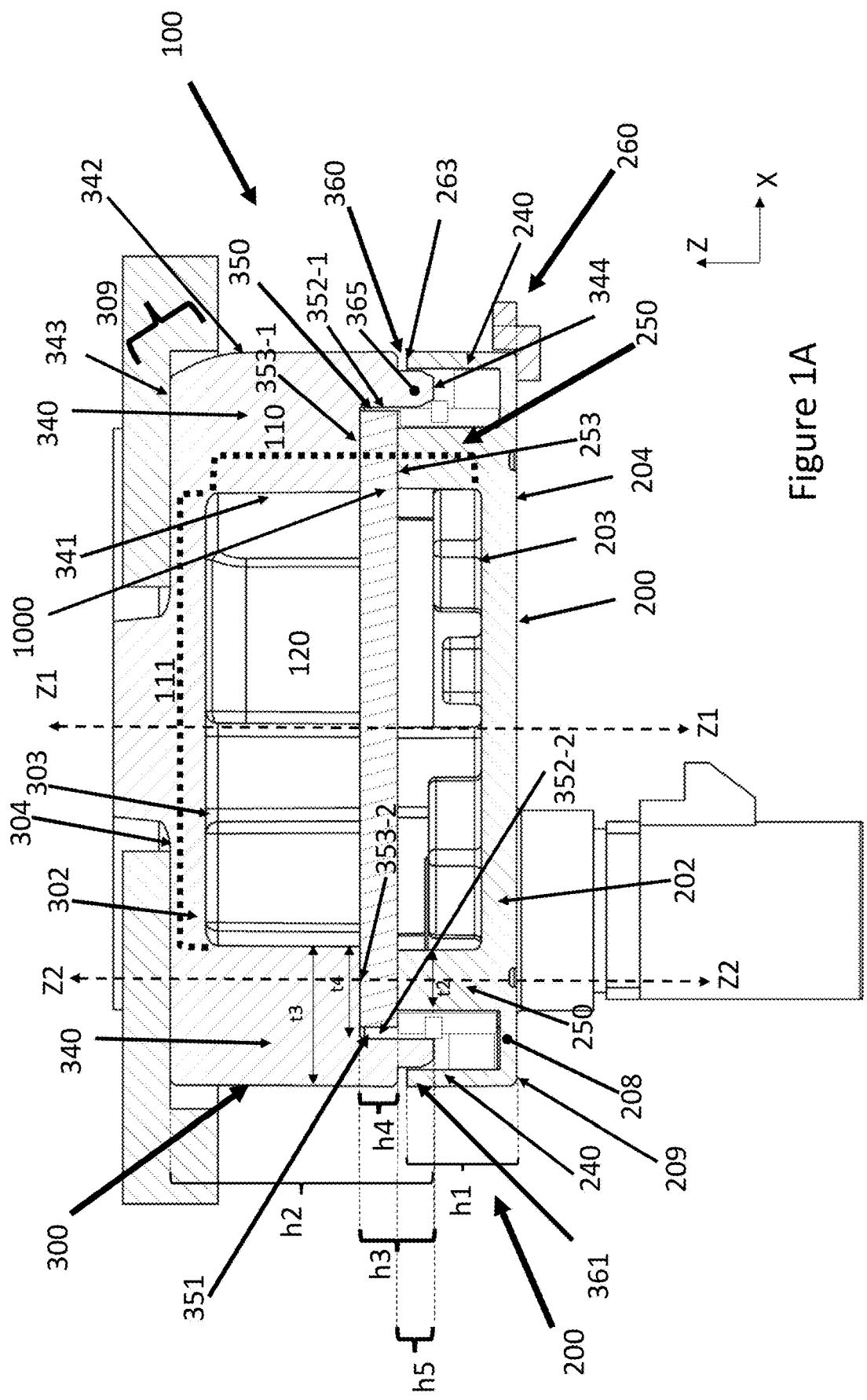
FIGS. 1A, 1B, 1C, and 1D provide cross-sectional views of a two-part housing assembly according to arrangements of the present disclosure in which a housing base and main body are located for coupling together, the housing base and the main body comprise corresponding locating and coupling features.

The following discussion provides many embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

For simplicity and clarity of illustration, reference numerals may be repeated among the FIG. to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limiting to the scope of the examples described herein.

Referring to the drawings, a housing 100 for housing electronic components, is described. In the arrangements, the housing 100 is configured to house a PCB 1000 and associated components. The housing 100 comprises a housing base 200 and a housing body 300. The housing body is configured for coupling to the base to form a housing 100 which when connected and closed defines an exterior and an interior space in which the PCB and components are accommodated effectively in a unitary housing.

The base 200 comprises a PCB retainer 250 and the housing body 300 comprises a corresponding PCB receiver 350. The PCB retainer 250 and PCB receiver 350 are configured for correspondence and such that when the base 200 is coupled to the housing body 300, the PCB 1000 is securely retained therebetween. In use, the PCB is seated between the base and body at the PCB retainer and PCB receiver. The PCB retainer and receiver are located internally within the housing and are directly aligned and positioned for use, when the externally accessible portions of the housing are aligned and engaged in a first pre-fixing step. The PCB receiver is defined by a recess that extends around an inner surface of a side wall of the housing body and the retainer by an internal wall located within the base. The base and the housing are configured such that when coupled, the base and housing body act together to position the receiver and retainer such that they are spaced apart (Z-direction) at a separation distance h4. The separation distance corresponds to the depth of the PCB. The space defined between the retainer and the receiver is configured to accommodate the PCB.

The base 200 further comprises a first housing connection member 260 and the housing body 300 comprises a corresponding second housing connection member 360. In the arrangement shown, the housing connection member 360 comprises a receiver, and the base connection member comprises a wall portion locatable in the receiver. The housing connection members 260, 350 located at an external side wall portion of the housing are configured for coupling together to allow secure fixing of the base to the housing body. The direction of coupling of the housing parts is the vertical (Z) direction, the coupling features are located at the interface between the two parts. The forces acting between the housing parts and the PCB are generally directed in the vertical direction.

The coupling between the base 200 and the body 300 parts of the housing is a two-part coupling. Each of the base and the body comprises two coupling features, provided essentially as two sets of corresponding coupling features. The first set being the retainer 250 and receiver 350 configured for engagement with the PCB and locating the PCB internally within the housing. The second set being the connection members 260, 360 configured for engaging and connecting the base and housing body to form the housing unit and defining the connection between the parts at the external peripheral side wall thereof.

The base 200 and housing body 300 are formed for conformity and the coupling features 250, 350 and 260, 360 are configured for correspondence, interaction, co-operation, and mating. As shown in the drawings, the external lateral and longitudinal (X-Y) dimensions of the base and housing body correspond. The base and housing body together define an internal space 120 or volume for accommodating the PCB 1000 and other components therein, having a height 110 (Z direction), a length 111 (X) and a laterally extending (Y) width dimension. The internal space 120 is defined by the inner surfaces of the base and body of the housing.

The body PCB receiver 350 and corresponding base PCB retainer 250 are located internally within the housing. As illustrated in FIG. 1A, the body receiver 350 is sized and formed to receive the PCB. The receiver 350 essentially provides a locator for the PCB within the housing body in the transverse (X-Y) directions, the retainer 250 acts together with the receiver 350 to provide positioning of the PCB at the required vertical location or vertical level (Z) internally within the receiver, in use.

The housing connection members 260 and 360 provide for a coupling of the two housing parts 200, 300 to define an external peripheral wall of the housing 240, 340 and to close and allow for a fixing or sealing of the housing about the PCB and components located internally therein. The connection members 260 and 360 are further configured for inter-engagement to securely fix the base to the body. The housing is connected at a connection region 370, located at the interface of the peripheral wall portions 240 of the base and body 340, where the connection members 260, 360 are engaged and fixed together. The connection is located between the upper and lower surfaces of the housing.

As shown in the arrangement, the housing body comprises a peripheral side wall 340 having a relatively wide extent or thickness t3. The wall 340 is formed to be robust and stable and to provide a stable support and security for the PCB. The wall 340 is active in both the retention of the PCB and the fixing of the base to the body, as it comprises formed on an inner surface a peripherally extending recess 351 that defines the PCB receiver and on the opposite outer side a peripherally extending recess 361 that defines the connection member 360. An intermediate portion 365 of the wall is located between the inner and outer recesses. The body comprises a double recess arrangement for coupling to the base. The PCB receiver 350 and connection member receiver 360 of the body are located at defined positions and locations relative to each other, to provide a precision location of the PCB within the housing and to provide secure retention of the PCB therein. The PCB receiver 350 and the connection member receiver 360 are concentric, spaced apart in transverse directions based on the depth of the wall portion between them, and spaced apart in the vertical direction such that each is at a different level relative to the housing.

The base 200 comprises a first outer 240 and a second inner side wall 250 arranged to extend from the transverse cover portion 202 in the direction of the body, and oriented generally at right angles thereto. The first and second side walls are concentric about a central vertical axis of the housing. Both walls extend parallel to the periphery of the base and are spaced apart a distance t7 that locates each with the corresponding part of the housing body for coupling. The base provides a double-wall coupling arrangement. The external wall defines a portion of the connection member 260 receivable in the outer recess 361 of the body. The internal wall essentially a baffle type wall that protrudes upwardly from an inner surface of the base to engage with and retain the PCB in use, in the inner recess 351 of the body. The inner wall 250 defines the PCB retainer. This separation provided between the first and second coupling members of the body and bae, which are active in the two separate functions of retaining the PCB and of fixing the base to the body, supports performance of the coupling in two-steps. Further, forces associated with the fixing step—to fix the base and body, are directed via the relevant connection members via the external wall portions of the housing, and as the housing parts are fixed a retention forces are directed to the retainer and receiver. The retention force acts in vertical directions via the receiver and retainer to positively engage the PCB at the contact surfaces. The connection member and retainer are spaced apart as described and accordingly the fixing force is directed to different portions of the housing than those in contact with the PCB. The fixing forces are directed away from the PCB.

Figure 6:
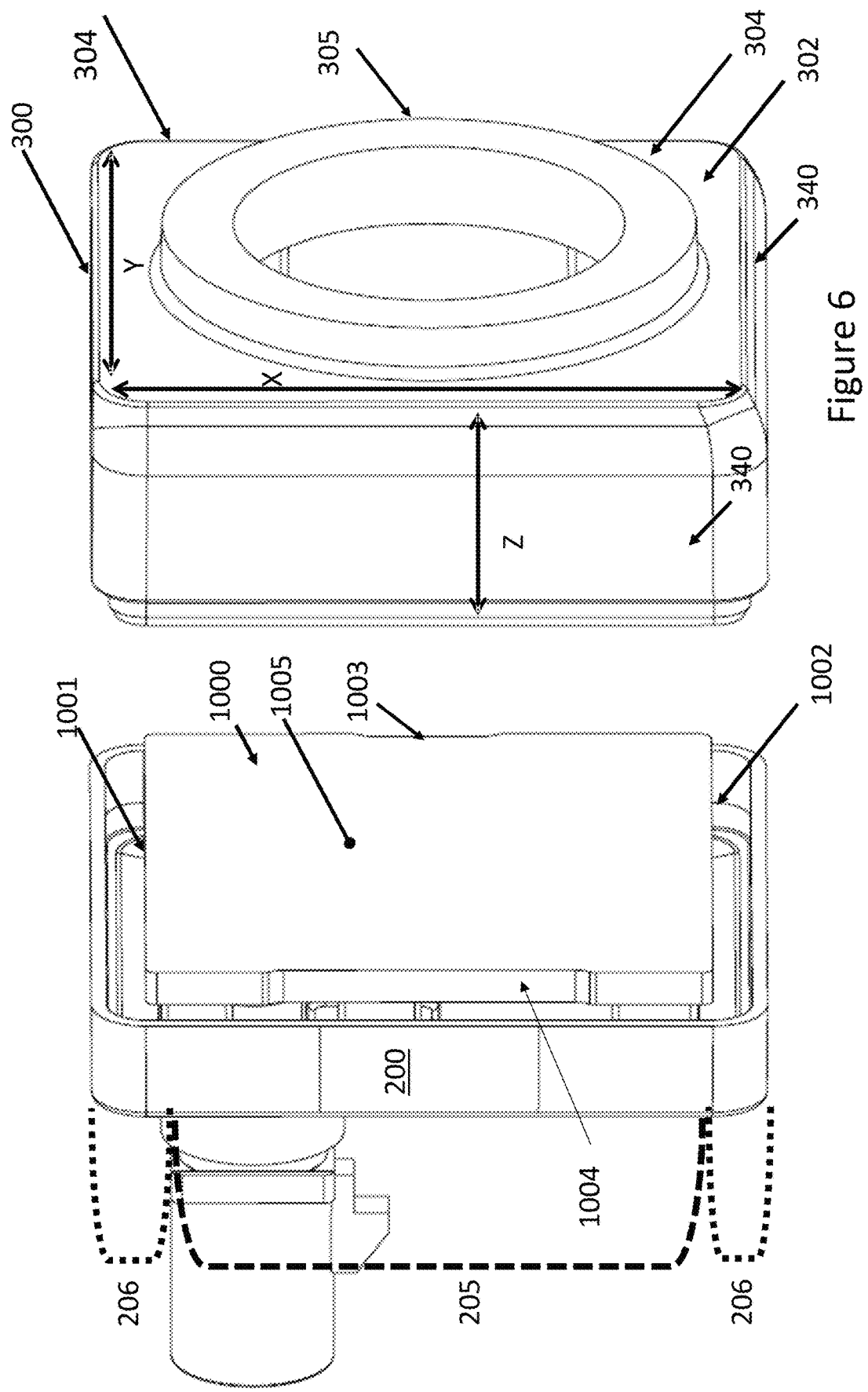
FIG. 6 illustrates an arrangement of a base, PCB and body as provided for assembly to form a housing according to an arrangement of the specification.

In the first instance the housing body 300, is described in further detail. The housing body 300 comprises an upper wall portion 302 arranged extending in longitudinal and lateral directions (X and Y) and having an inner surface 303 and an outer surface 304. As shown in FIG. 6 the housing of the arrangement comprises a lens receiver 305. In use the inner surface 303 is arranged to face the interior 120 of the housing and the components therein and the outer surface 304 is arranged to form an external wall of the housing. The housing body 300 further comprises side wall 340 extending essentially at right angles to upper wall portion and in the vertical direction (Z) towards the base 200 to which the housing body is to be coupled. The side wall 340 defines an external peripheral wall of the housing body. The side wall 340 has an upper end 343 and a lower end 344. The side wall is arranged to extend peripherally and continuously around the housing body 300. The side wall 340 has an inner surface 341 and an outer surface 342. The side wall generally has an overall height h2 from the top end 343 to the lower end 344, and a thickness t3 from the inner surface 341 to the outer surface 343. The thickness is altered in step type form at a lower end 344, at the recesses 351, 352.

The arrangement of FIG. 6 shows a housing configured for receiving a PCB and configured to be used in an imaging system, the housing include a lens holder for receiving a lens and holding it is position relative to a camera mounted on the PCB. It will be appreciated that the specification is not limited to a housing for a PCB in the context of an imaging arrangement, features of the housing may be varied or adapted for other applications, as required, for example as shown in the arrangement of the drawings the housing includes a lens holder. The lens holder is an and optional feature. The specification is directed to a housing for housing a PCB and having the coupling members as described in the arrangements.

The side wall 340 comprises an inner recess 351 and an outer recess 361 both of which extend continuously about the periphery of the side wall 340. The recesses 351 and 361 are concentric. The inner recess is offset relative to the outer recess in the vertical direction (Z). The inner recess is also offset relative to the outer recess in the transverse directions (X-Y) such that it is located at a central internal portion of the housing. The inner recess 351 defines the PCB receiver 350 and the outer recess 361 defines the housing connection member 360. The PCB receiver 350 and the connection member 360 are formed on opposing sides of the side wall 340 near the lower end 344 thereof.

The PCB receiver 350 comprises a recess 351 having vertically (Z-X/Y) orientated end and side walls 352 arranged to face end and side walls of the PCB, and transversely oriented (X-Y) walls 353 configured to contact portions of the upper side of the PCB in use. The recess 350 is shown as having transverse portions 353-1, 353, 2 and the vertical portions 352-1, 352-2 in FIG. 1A located in proximity to first and second ends of the PCB. The transverse walls 353 define a contact surface at which the receiver contacts a portion of the upper surface of the PCB. The transverse walls 353 and the vertical end and side walls 352 of the receiver 350 are essentially arranged in an L-shaped or inverted L-shaped form. The receiver 350 is formed continuously around the interior of the side wall 340 of the housing body.

Figure 1B:
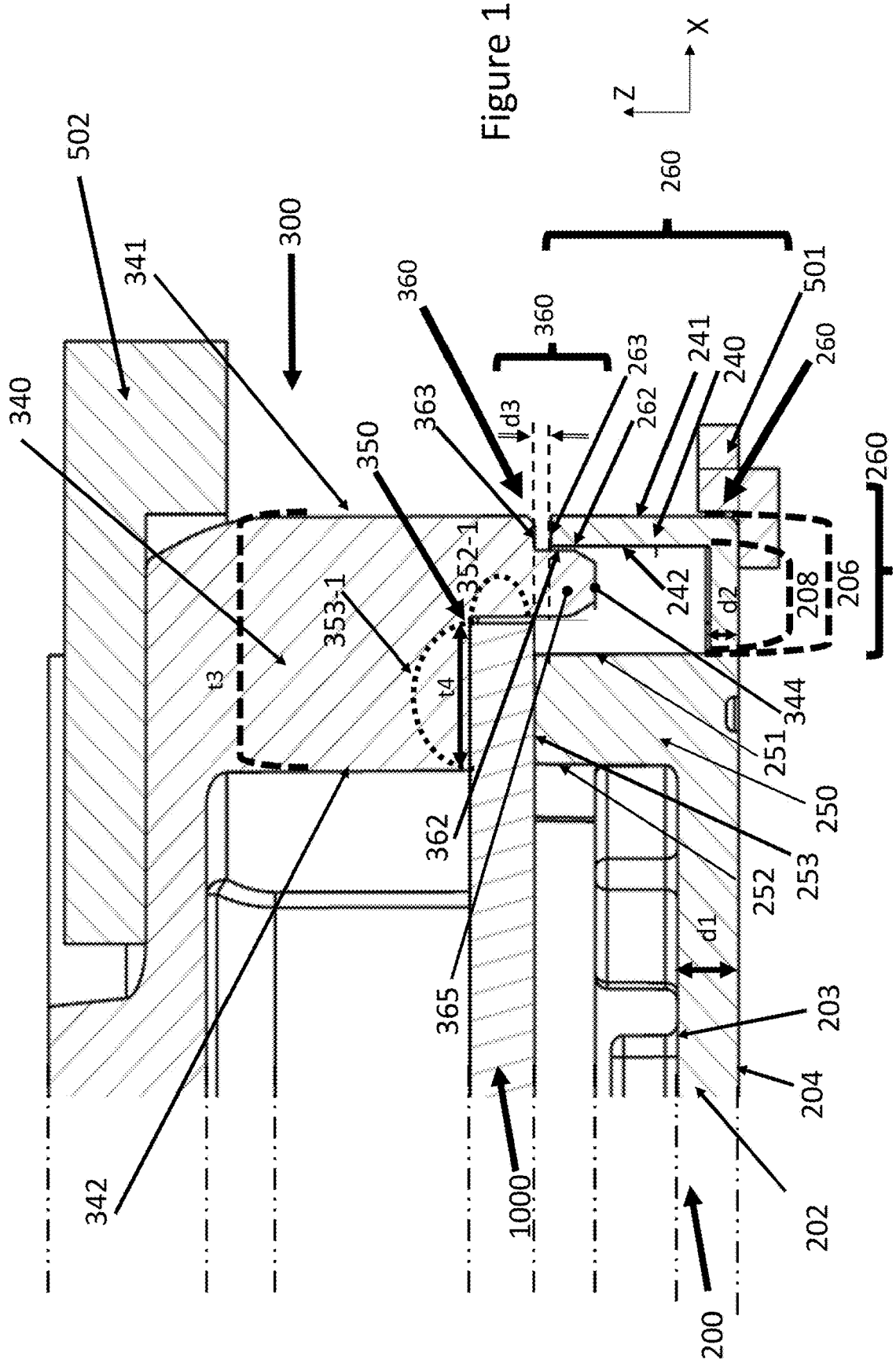
Figure 1C:
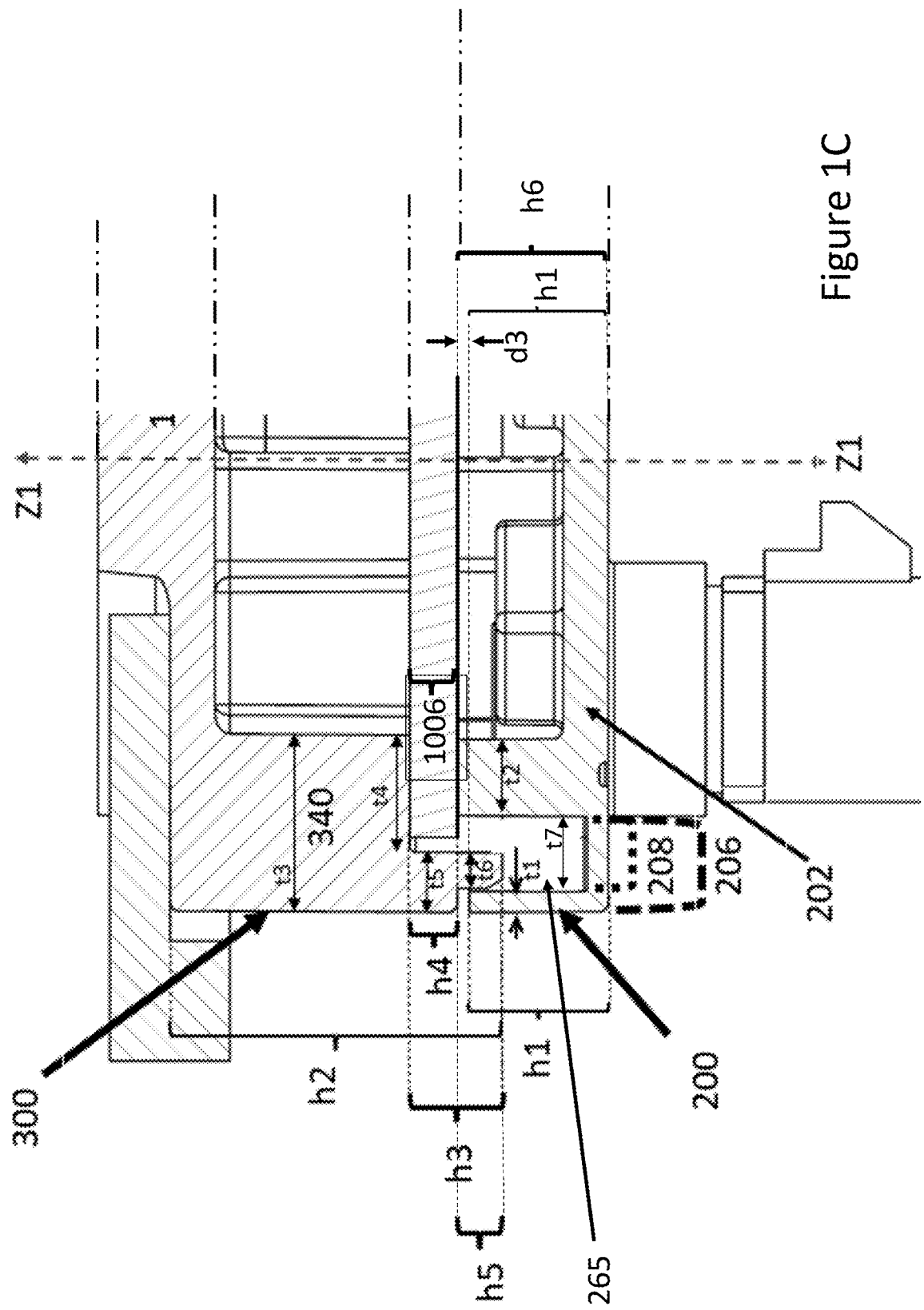
Figure 1D:
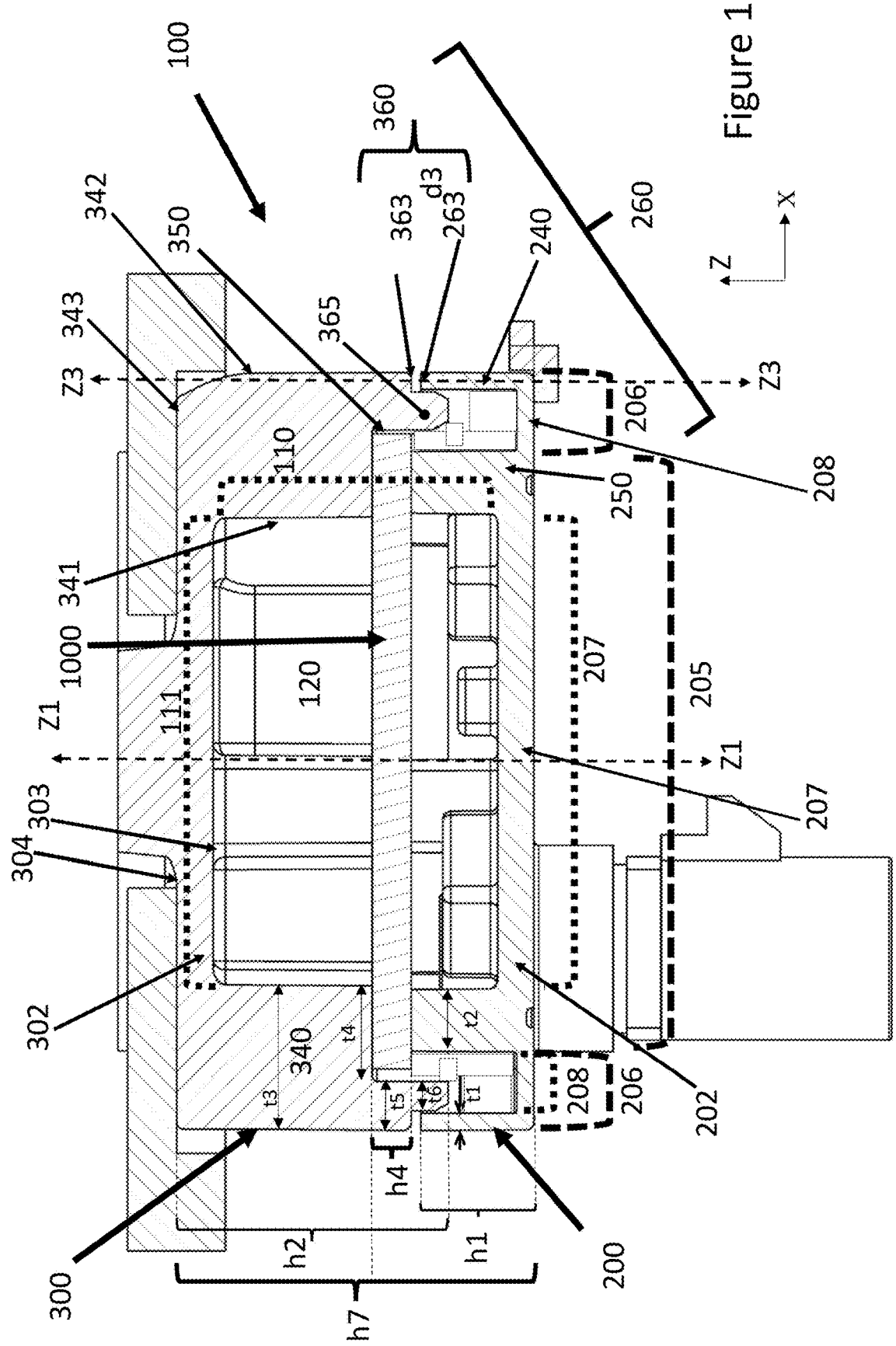

As shown in FIGS. 1A and 1B, the vertical wall 352-1 is recessed in the longitudinal direction (X) relative to the inner surface 341 of the side wall 340 by a distance t4, and the transverse wall 353 is recessed relative to the lower end 344 of the side wall 340 by a distance h3. The transverse wall 353 is further offset in the vertical direction relative to a transverse wall 363 of the connection member by a distance h4 corresponding to the depth of the PCB.

The receiver 350, as defined by the recess 351 has a picture frame or quadrilateral frame type form open to the center and the internal space 120 of the housing and having peripheral side walls 352 and a peripherally extending contact surface portion 353. The PCB is receivable therein such that it is engaged with the receiver 350 and the retainer 250 of the base at peripheral portions of the upper and lower surfaces only of the PCB, this allows a secure and stable location of the PCB and secure retention of the PCB while providing that the remaining area of the PCB is accessible and available for supporting components etc and accessible. The PCB is essentially mounted within a frame defined by the receiver and retainer.

The receiver 350 is configured for receiving and locating the PCB within the housing body, in the arrangement shown, such that the PCB is spaced apart from the transverse (X-Y) inner surfaces 303, 203 of the body and base. The overall length, width, and height of the receiver 350, and the housing 100, can be selected and varied depending on the form of the PCB. In FIG. 1 which provide longitudinal cross-sections, first 1001 and second 1002 longitudinal ends of the PCB 1000 are shown seated in the receiver between lateral end walls 352-1 and 352-2 at opposite ends of the housing, and also in positive contact with the adjacent peripheral portions of transverse retainer wall 353. The longitudinal ends 1001, 1002 are located adjacent to and facing internal walls 352-1 and 352-2 of the receiver but not in contact with them, which again allows for a limiting of transverse forces between the housing and the PCB. The arrangement allows for accurate location of the PCB within the housing and maximizes the area of the PCB that is exposed while ensuring that the PCB is retained securely on all sides. Further the receiver is dimensioned to ensure tolerances for mounting the PCB. The drawings show longitudinal cross-sections, it will be appreciated that the receiver 350 is similarly arranged adjacent to and facing the PCB at longitudinal side walls thereof.

While in the arrangements of the drawings the housing 100 has a generally quadrilateral or cuboid form, it will be appreciated that other forms may be provided based on requirements, and in such case that the forms of the walls, connection member walls would be arranged for correspondence with the form of the housing. The form may also be varied taking into account the form of the PCB.

Housing connection member 360 is defined by the recess 361 formed at an external portion or surface 342 of the side wall 340, near the lower base facing end 344. The recess 360 has a transversely oriented (X-Y) wall portion 363 and a vertically oriented (Z-X/Y) wall portion 362 arranged generally in an L-shaped form or at right angles to each other. The housing connection member 360 defines a receiver for receiving the corresponding housing connection member of the base. The transverse wall portion 363 is recessed relative to the lower end 344 by a distance h5, and the vertical wall portion 362 is recessed relative to the outer surface 342 a distance t1. An intermediate wall 365 is provided at the lower end 344 between the two recesses 351, 361 on opposing surfaces of the wall 340. The intermediate wall 365 has a body of thickness t6 and a height (Z-direction) h5 relative to the transverse wall 363 of the outer recess 361, and h3 relative to the transverse wall 353 of the inner recess 351.

The transverse wall 363 of the connection part 360 is located at a vertical separation h4, generally corresponding to the height or depth of the 1006 of the PCB, relative to the transverse wall 353 of the receiver 350 such that the receiver 350 and connection member 360 are offset in the vertical direction a distance h4 corresponding to the depth of the PCB. The offset configuration of the first and second recesses 351 and 361 allows for control of forces including limitation of the effects of forces, that might be exerted via the housing or during connection of the housing parts, on the PCB. The transverse wall 363 of the connection member 360 acts as a stop when the base 200 is being connection to the body. As the base connection member 260 is brought into proximity to and engaged with the body, an upper contact surface 263 thereof is engaged with the stop 363 of the connection member 360 which located the body and base as required and prevents further movement or displacement of the base relative to the housing in the Z direction of connection.

The receiver 350 and the connection member 360 features of the body are effectively configured to function together in correspondence and co-operatively provide for a control of forces acting on the PCB while accommodating the requirements for fixing the housing parts and retaining the PCB. The receiver 350 and connection member 360 by virtue of the configuration and their controlled interaction allow a precision control of the location and orientation of the PCB within the housing. An example application and use of the housing unit is shown in the drawings in which the housing is used to support a lens coupled to an imaging device located on the PCB. High precision is required in the relative positioning of the lens and imaging device as these optical elements are arranged in alignment along the optical path. The arrangements of the present application allow improved control of the orientation of the plane (transverse XY) of the PCB and the imaging device relative to the lens and housing which advantageously supports improved precision and improved imaging operation. Similarly, the arrangement of the housing parts, by virtue of the judicious configuration of features the coupling features allows a control and limitation of forces at the PCB, to prevent any damage or the introduction of any misalignment of the PCB relative to the orientation thereof.

The external side wall 340 provides a solid and robust external wall of thickness t3 of the body which provides a robust and solid support for the PCB. As described further below the connection member 260 of the base is brought into engagement with the connection member 260 of the body which provides by virtue of the form and configuration of the wall 340 a solid and robust receiver and stop that prevents forces being transmitted from the exterior connection region towards the PCB.

The base 200 is described with reference the drawings in particular in the first instance FIGS. 1 and 2. In the arrangement of the drawings, the base 200 is considered to define the cover of the housing by virtue of the arrangement and features. The base 200 has a height h1/h6 (vertical extent of the connection member or retainer in the Z direction) less than the height h2 of the body portion. When the base 200 is coupled to the body 300, a portion of an outer peripheral side wall 240 is arranged externally of coupling member portion 360 of the peripheral wall 340 of housing body. The base also defines a portion of the external peripheral wall 240, 340 of the housing 100. When the base is coupled to the housing body it is arranged extending across the housing body and to cover the interior space 120 defined by the housing unit 100 and the PCB and components therein.

The base 200 comprises a base wall portion 202 extending in a transverse plane (X and Y) and having an inner surface 203 and an outer surface 204. In use, the inner surface 203 is arranged to face the interior 120 of the housing unit 110 and the components therein and the outer surface 204 is arranged to form an external wall of the housing.

The base 200 further comprises internal retainer wall 250 and an outer peripheral side wall 240, both arranged extending essentially at right angles relative to the inner surface 203 and oriented generally vertically in the direction of the housing body for coupling. The outer wall 240 which defines an external wall of the base is arranged to extend peripherally and continuously around the outer edge portions of the base wall portion 202. The internal retainer wall 250 is arranged to generally parallel to the outer side wall. The inner and outer walls are concentric and spaced apart a distance t7. The internal wall 250 may be continuous similar to the outer wall. However, it will be appreciated that the internal retainer wall 250 could have an alternative form for example, a plurality of spaced apart internal wall portions 250-1, 250-2 ... 250-n (reference is made to arrangements illustrated in FIG. 5).

While in the arrangement the outer wall has a continuous form and a generally square or rectangular form in a lateral cross-section of the base, it is appreciated that it may have suitable alternative forms. The outer walls of the base and body are formed for conformity and other corresponding wall arrangements could be provided that support the function of the housing.

Figure 2A:
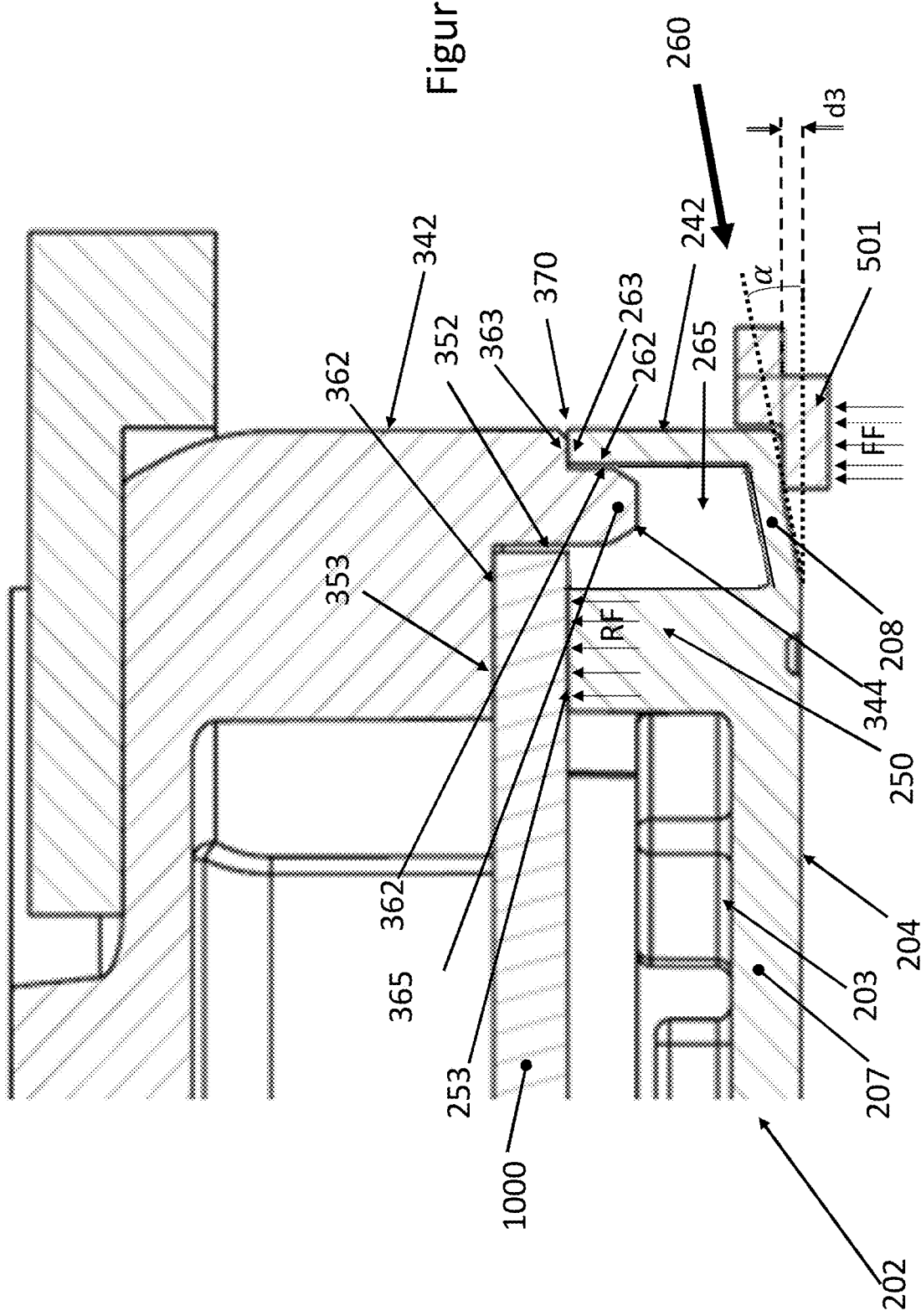
FIGS. 2A and 2B provide a cross-sectional views of the two-part housing assembly of FIG. 1, which a housing base and main body shown coupled together in a fixing position such that a connection member of the base is located at the fixing position in a connection of the body.
Figure 2B:
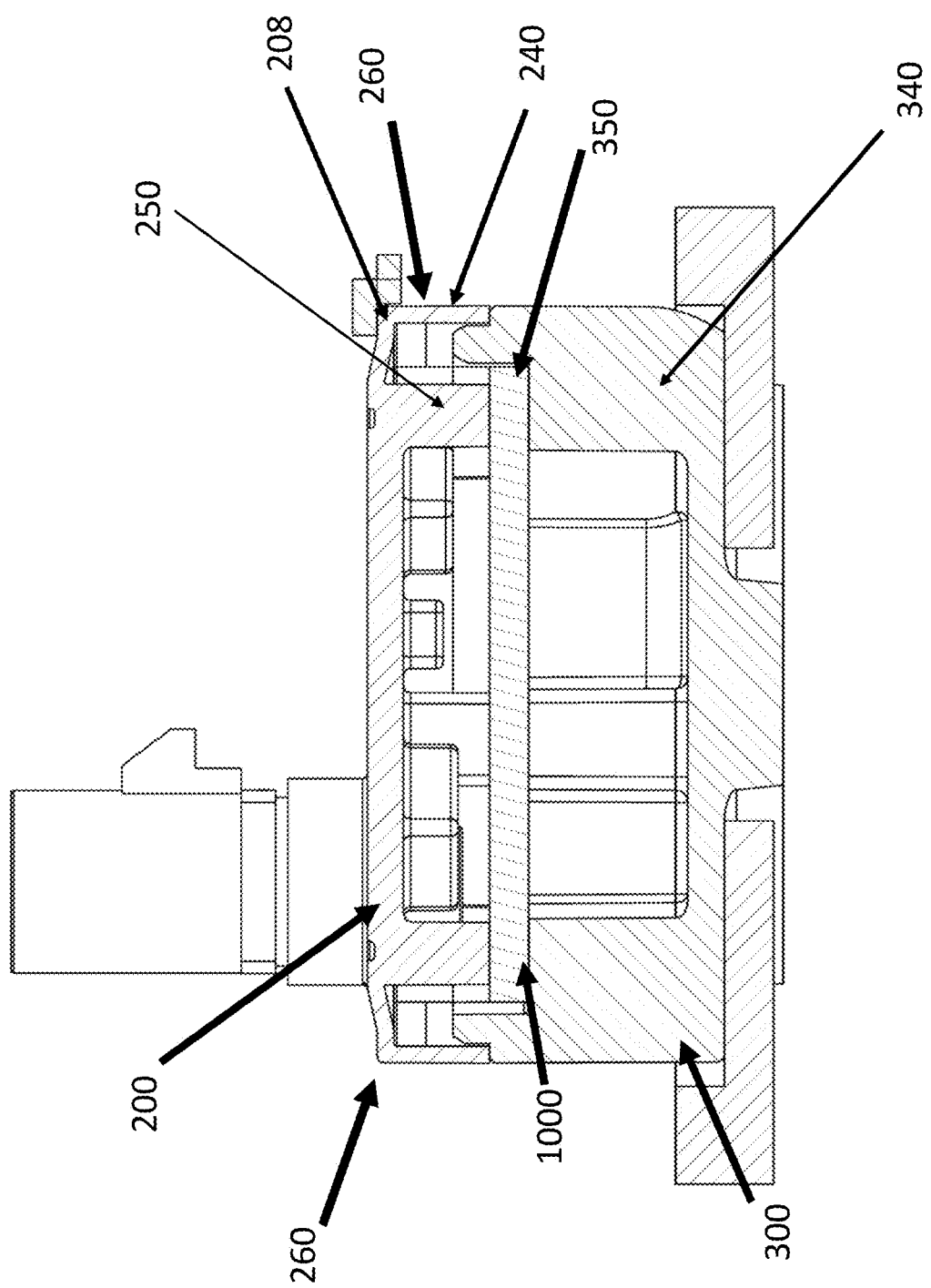

Referring to FIGS. 1, 2 and 5, the base wall portion 202 comprises first and second zones or areas, generally provided as a first central zone 205 and a second peripheral zone 206. The peripheral zone 206 is arranged externally and peripherally of the central portion 205, between the inner and outer walls. The central zone extends between opposing outer surfaces 252 of the retainer wall and comprises a base web 207 at the central portion of the base wall 202. The peripheral portion 206 extends from an outer surface 252 of the internal wall 250 to an outer surface 242 of the outer wall 240. A peripheral web portion 208 of the base wall 202 extends between the inner wall 250 and the outer wall 240. The zones and walls are concentric.

The inner wall 250, the outer wall 240, and the peripheral web portion 208 of the base together define a trough 265 arranged between the inner wall 250 and the outer wall 240. The trough 265 has a width t7. The base wall web 208 at the trough 265 has a thickness or depth d2 (Z-direction) less that the thickness or depth d1 (Z-direction) of the base wall web 207 at the central portion. The peripheral web portion 208 is configured to be displaceable relative to the other portions of the housing. The outer wall 240 is connected to the central areas 205/207 of the housing by the peripheral web 208 and by virtue of the configuration thereof, the outer wall is configured to be moveable or displaceable in a vertical direction relative to the other portions of the base. The outer wall has a thickness or width t1 less than the width t2 of the retainer wall, and the width t3 of the wall of the body.

The peripheral web may by virtue of the properties and form thereof be flexible relative to other portions of the housing. For example, as noted in the arrangement of the drawings—the wall of the peripheral web portion may have a reduced thickness relative to other portions.

The depth d1 of the base wall 202 at a central zone 207 between the internal PCB retainer walls 250 is greater than the depth d2 at the peripheral web portion 208 between the inner and outer walls. The ratio of the depth of the wall at the interior portion 208 to the peripheral portion may for example be of the order of 2:1 or greater. However, it is appreciated that other ratios that supper the functionality may apply. The key is that the peripheral portions 208 or 206 are displaceable relative to the central portions 205, 207 which in turn are more rigid such that the peripheral portion moves relative to the central portion under the application of a fixing force. The thickness t2 of the retainer wall 250 is greater than the thickness t1 of the outer peripheral wall 260, the ratio of the thickness t2 to t1 may be greater than 2:1. Further the outer wall 240, is moveable between a first pre-fixing state, when lower edge 209 of the base wall is aligned vertically with the lower surface 204 of the base 202, and a second fixed state when the lower edge is displaced upwardly (Z) relative to the lower surface 204.

The connection member of the base 260 is defined by the outer wall 240, web 208 and by the space provided by the trough 265 between the outer wall and retainer. Connection member 260 comprises an upper contact surface 263 for engaging with and contacting the stop 363 of the housing connection member receiver 360 for fixing. The connection member 260 is moveable relative to body and to the other portions of the base. The features of the connection member 260 act together to provide the dissipation of the external fixing force away from the PCB and to the connection member to provide the connection.

The spacing provided between the inner and outer walls of the base is configured to support the two-part coupling of the base and the housing. The trough 265 is configured by the form including depth and width to allow for a controlled movement of the connection member 260 relative to the retainer wall. It is appreciated that the trough 265 may comprise further features that together with the form and properties of the peripheral wall 240 and peripheral web 208 define or control the relative movement or range of movement of the base connection member 260 relative to other parts of the base.

FIG. 1 for clarity presents a two-dimensional cross-sectional view of the housing, it will be appreciated that the interior space defined by the walls of the housing defines an interior volume 120 having longitudinal, lateral and vertical dimensions—however for the purpose of FIG. 1 the vertical and longitudinal directions only are shown. Reference is also made to FIGS. 5A and 5B which show plan views of arrangements of the inner surface 204 of the base 200.

The inner wall 250 has an inner surface 251 and an outer surface 252 an upper end 253 that defines a retainer contact surface 253 configured to engage with a portion of the lower surface of PCB 1000.

In use when the base 200 and body 300 are connected, the PCB receiver 350 and PCB retainer 250 are located to co-operate to retain the PCB in position through a controlled contact between each of the receiver and the retainer with the PCB. In addition, the base connection member and the body connection member are configured for cooperation with the PCB retainer and receiver such that forces acting at the PCB are limited throughout the process of attaching the base and the housing and when the base and housing are attached.

The process of attaching the base and housing is a two-stage process synergistically linked to the two-part coupling configuration of the base and the housing. An assembly process is illustrated with references to FIG. 4A to 4E.

In the first stage—for example as illustrated in FIGS. 1 and 4A, 4B and 4C, the base 200 is brought into alignment with the housing 300 for connection thereto. This is a pre-fixing position, at which the connection members 360, 260 of the housing and base are located in alignment for fixing and the retainer 250 and receiver 350 engage the PCB.

The PCB is located in the receiver 350. PCB contact surface 253 contacts portions of a first surface of the PCB to positively retain the PCB within the receiver, and such that portions of the second opposite surface of the PCB are located in positive contact with the PCB contact surface 353 of the receiver.

The form is such that a defined space is provided to accommodate the PCB so that it is retained securely but not subjected to forces greater than the controlled retaining or retention force RF.

The transverse contact surface 353 of the receiver provides a relatively large surface area for contacting the proximate portions of the upper surface of the PCB and therefore forces acting at the interface between the PCB and receiver are dispersed over a relatively large contact area and applied evenly. The retainer similarly comprises a contact surface 253 which has a relatively large surface area such that forces are applied in a dispersed manner and evenly across the contact area of the PCB. The contact surfaces 353 and 253 for contacting the PCB each have a footprint which is relatively broad allowing for use of the housing 100 with PCBs of different area. The contact surfaces 253, 353 each have an area sufficient to overlap with PCBs of different surface area or footprint which can be arranged between the recess 350 and the retainer 250.

Further, the receiver has an area greater than that of the PCB, such that the forces acting between the vertically oriented (Z-X, Z-Y) contact surfaces 352 and the end and side wall of the PCB are limited. The PCB may be located in the receiver such that there is contact between the upper and lower surfaces thereof and the housing but such that the end and side walls of the PCB are spaced apart from receiver. This also allows for flexibility and ease in locating the PCB within the receiver. The retainer 250 is guided into location and located in contact with externally facing portions of the lower surface of the PCB only, as the base is aligned with the housing at the corresponding connection members at the external walls of the housing.

Therefore, the housing and base are configured to provide (i) a precision location of the PCB within the housing, including at a controlled orientation, and to further provide (ii) for control of forces between the housing and PCB and prevention of application of force to the PCB, greater than the retaining or retention force RF, as provided for by the configuration of and spacing of the receiver, stop, and retainer.

The receiver and retainer, provide for simultaneous application of the controlled retention force on all sides of the PCB—this is particularly important to allow for a control of orientation of the PCB relative to the housing and other components. In use the PCB is retained in a plane as defined by the configuration of the housing. In addition, the simultaneous application of the controlled retention force prevents a situation in which a portion of the PCB might be subjected to a greater force than other portions during assembly which might result in a warping or uneven orientation.

The first stage allows for retention of the PCB as described above as the base and housing are located in a pre-fixing position or configuration. If required, at the pre-fixing stage the base and housing can be decoupled for example to allow for a repositioning of the PCB.

In the pre-fixing stage the contact surface 263 of connection member 260 is located spaced apart from the engaged location in the connection member 260 by a gap having a depth d3. While a cross-sectional view is illustrated it is appreciated that the gap is provided around the periphery of the housing.

In the second stage, the base and housing are fixedly connected at the connection members 260 and 360.

The fixing step includes the application of controlled force, referred to as the fixing force FF to the housing at actuator 501 or fixing tool 501.

In FIG. 4C the fixing tool is located at external edge portion 209 of the base 200. The fixing force FF is applied as illustrated in FIG. 4D which results in the displacement of the connection member 260 relative to the other parts of the housing, from a first pre-fixing position to a final fixing position when fully engaged with the connection member 360. Another tool or external support 502 may be located to the external peripheral edge 309 of the housing. When the fixing force FF is applied to the connection member 260 by actuator 501, the connection member 260 is displaced to the fixing position and the connection surface 263 is engaged with the stop 363 of the body. The required fixing force will be selected based on calibration and the properties of the material and the form of the connection member portion of the base.

The connection member is displaced in a vertical direction. As shown in FIGS. 3A and 4D, the peripheral connection portion 208 is moved from a rest position parallel to the lower surface 204 of the cover 202 to an angle α relative to the lower surface. This angular displacement of the portion 208 provides a vertical displacement of the contact surface 263 of the connection member 260. The contact surfaces may be connected by welding as in the arrangements. It will be appreciated that the contact surfaces 263 and 363 may be connected by other suitable means.

By virtue of the arrangement of the base and body of the housing, the fixing force FF can be effectively directed to the outer peripheral part of the base, and further controlled and directed to act in generally vertical directions to provide the connection of the base and housing. The fixing force is active in planes offset from the PCB. The fixing force FF is not transmitted to the PCB but rather relatively weaker retention forces may apply at the interface between the PCB and housing, to positively engage the PCB, receiver and retainer when the base is engaged with the housing. The retention forces RF act in vertical directions at the interfaces between the receiver and PCB and the retainer and the PCB. No transverse forces are transmitted via the external walls to the PCB, by virtue of the configuration of the base and body.

The forces for retaining the PCB in the receiver and for fixing the base and body of the housing are directed to different and spaced apart portions of the housing. Accordingly, the location and orientation of the PCB as arranged in the first coupling or retaining step is not affected by the second coupling—for fixing step.

Starting from the pre-fixing position, the contact surface 263 of the connection member 260 is located spaced apart a distance d3 corresponding to the difference in height h6 of the retainer wall 250 and the height h1 of the external wall 240 of the base. Therefore, the contact surface 263 is located spaced apart from the stop 363 in the vertical (z-direction) in the pre-fixing position.

To provide a fixing of the connection member a controlled force is applied to the base at a located to provide movement of the peripheral portions 206, 208 of the base 202 and of the external wall 240 to bring the connection member 260 into a fixing position at the connection member 360. The connection members are fixed at the connection interface by welding in the arrangement. It will be appreciated that other fixing means may be provided.

The controlled force—referred to as the fixing force FF may be provided simultaneously around the periphery of the housing. By virtue of the configuration of the housing the connection member is relatively displaceable and the force results in movement of the displaceable member relative to the retainer and the side wall of the housing with the result that the fixing force FF is not directed to the PCB but rather into providing the connection. As the housing parts are moved in a fixed engagement, retention forces are provided at the interfaces between the housing and PCB.

As shown in FIG. 3, the peripheral portion 206, 208 bends or deforms under application of the fixing force FF and this peripheral portion is under the application of the fixing force FF arranged at an angle $\alpha$ relative to central cover portion 202 of the base. The outer wall 240 is moved in the vertical direction (Z) towards the contact surface 363 a distance d1, such that the contact surface 263 is clamped at the contact surface 363.

The arrangement provides of the housing 100 provides for protection of the PCB and components as the housing is fixed. In addition, the arrangement of the specification provides that when the PCB and components are located as required in the first stage of coupling the housing, that precision location is not affected or revisited during the fixing of the housing. Then the fixing step is affected by the application of an external force to fix the connection members. When the connections are moved into the fixing position retention forces are directed via the body and base to the PCB to retain is securely.

In the arrangement illustrated the housing has a generally cuboid form. The peripheral portion 205 of the base in the drawings has the same extent or width in the lateral and longitudinal directions around all sides of the cover.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A housing for a printed circuit board (PCB), the housing comprising:
    a housing base; and
    a housing body, wherein:
    the housing base includes a PCB retainer,
    the housing body includes a corresponding PCB receiver,
    the PCB retainer and the PCB receiver are configured such that, when the housing base is coupled to the housing body, the PCB is retained in position securely therebetween,
    the housing base includes a base connection member having a contact surface,
    the housing body includes a corresponding body connection member,
    the base connection member is displaceable under application of a controlled fixing force for engaging with body connection member,
    movement of the base connection member results in a vertical displacement of the contact surface of the base connection member,
    the housing base is configured for correspondence and mating with the housing body,
    the housing base includes:
        a base cover portion including a central cover portion and a peripheral cover portion,
        an external peripheral wall that includes the base connection member, and
        an internal wall that includes the PCB retainer,
    each of the peripheral walls extends from the housing base in a direction of the housing body and is configured for coupling thereto,
    the external peripheral wall is arranged spaced apart from the internal wall and extending parallel thereto, and
    the peripheral cover portion is arranged between the internal and external walls and connects the external wall to the central cover portion.

2. The housing of claim 1 wherein:
    the PCB includes upper and lower surfaces with a plurality of peripherally located contact portions, and
    the PCB receiver and the PCB retainer are configured to engage the PCB simultaneously at the plurality of peripherally located contact portions.

3. The housing of claim 1 wherein the base connection member and the body connection member are located externally to and spaced apart from the PCB receiver and the PCB retainer such that the controlled fixing force required to fix the housing base to the housing body is directed to the connection members at locations offset from the PCB.

4. The housing of claim 1 wherein:
    the base connection member and the body connection member are aligned in a first pre-fixing position, and
    in the first pre-fixing position the PCB is located within the PCB receiver such that a contact portion of an upper surface of the PCB is engaged in contact with the PCB receiver by the PCB retainer arranged in contact with an opposing contact portion of a lower surface of the PCB.

5. The housing of claim 4 wherein in the first pre-fixing position the base connection member is located in a pre-fixing position at the body connection member, such that the connection members are vertically aligned and the contact surface of the base connection member is located spaced apart in a vertical direction from a corresponding contact surface of the body connection member.

6. The housing of claim 1 wherein:
    the housing body includes a transverse cover portion and a peripheral side wall depending from an outer peripheral portion thereof, and
    the peripheral side wall includes a first inner recess defining the PCB receiver and a second outer recess defining the housing body connection member.

7. The housing of claim 6 wherein:
the inner recess is located offset in a vertical direction relative to the outer recess by a distance corresponding to a depth of the PCB to be located between the PCB retainer and the PCB receiver of the housing, and
the PCB receiver and the body connection member are configured to cooperate to provide control of forces between the housing and PCB.

8. The housing of claim 1 wherein:
the peripheral cover portion is relative to other portions of the cover and the housing body, and
the peripheral cover portions such that it is moveable or deformable when a force is applied thereto.

9. A method of assembly of a printed circuit board (PCB) housing to provide a controlled location and retention of a PCB for operation, the method comprising:
providing the PCB housing, wherein:
the PCB housing includes a housing base and a housing body,
the housing base and the housing body are configured to provide a two-part coupling of the housing base to the housing body to form the PCB housing,
the housing base includes a base connection member having a contact surface,
the housing base includes:
a PCB retainer,
a base cover portion including a central cover portion and a peripheral cover portion,
an external peripheral wall that includes the base connection member, and
an internal wall that includes the PCB retainer,
each of the peripheral walls extends from the housing base in a direction of the housing body and is configured for coupling thereto,
the external peripheral wall is arranged spaced apart from the internal wall and extending parallel thereto,
the peripheral cover portion is arranged between the internal and external walls and connects the external wall to the central cover portion,
the housing body includes a corresponding PCB receiver,
the PCB retainer and the PCB receiver are configured such that, when the housing base is coupled to the housing body, the PCB is retained in position securely therebetween,
the housing body includes a corresponding body connection member,
the base connection member is displaceable under application of a controlled fixing force for engaging with body connection member, and
movement of the base connection member results in a vertical displacement of the contact surface of the base connection member;
locating the PCB in the PCB receiver;
locating the housing base and the housing body in a pre-fixing position;
applying the controlled fixing force such that the base connection member is displaced into a fixing location relative to the body connection member; and
fixing the housing base to the housing body.

* * * * *